(12) United States Patent
Choi et al.

(10) Patent No.: US 9,312,027 B2
(45) Date of Patent: Apr. 12, 2016

(54) METHOD OF OPERATING NONVOLATILE MEMORY DEVICE CONTROLLED BY CONTROLLING COUPLING RESISTANCE VALUE BETWEEN BIT LINE AND PAGE BUFFER

(71) Applicant: SK hynix Inc., Gyeonggi-do (KR)

(72) Inventors: Won Yeol Choi, Gyeonggi-do (KR); Eun Joung Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/485,364

(22) Filed: Sep. 12, 2014

(65) Prior Publication Data

US 2015/0003159 A1    Jan. 1, 2015

Related U.S. Application Data

(62) Division of application No. 13/726,861, filed on Dec. 26, 2012, now Pat. No. 8,867,274, which is a division of application No. 12/775,562, filed on May 7, 2010, now Pat. No. 8,355,286.

(30) Foreign Application Priority Data

May 8, 2009    (KR) .................. 10-2009-0040134
Apr. 28, 2010    (KR) .................. 10-2010-0039436

(51) Int. Cl.
*G11C 16/04*    (2006.01)
*G11C 16/34*    (2006.01)
*G11C 11/56*    (2006.01)
*G11C 16/10*    (2006.01)
*G11C 16/06*    (2006.01)
*G11C 16/26*    (2006.01)

(52) U.S. Cl.
CPC ........ *G11C 16/3459* (2013.01); *G11C 11/5628* (2013.01); *G11C 16/0483* (2013.01); *G11C 16/06* (2013.01); *G11C 16/10* (2013.01); *G11C 16/26* (2013.01); *G11C 16/3436* (2013.01)

(58) Field of Classification Search
USPC ..................... 365/185.12, 185.22
See application file for complete search history.

(56) References Cited

U.S. PATENT DOCUMENTS

2008/0225597 A1* 9/2008 Park ............. G11C 16/3454
                                                                  365/185.22
2008/0225600 A1* 9/2008 Park ............. G11C 16/26
                                                               365/185.25

* cited by examiner

*Primary Examiner* — Hoai V Ho
(74) *Attorney, Agent, or Firm* — IP & T Group LLP

(57) ABSTRACT

A method of operating a nonvolatile memory device includes determining whether a program operation is performed on even memory cells coupled to even bit lines of a selected page, setting a coupling resistance value between odd bit lines of the selected page and page buffers depending on whether the program operation for the even memory cells is performed, performing a program operation on the odd memory cells coupled to the odd bit lines, and coupling the odd bit line to the page buffer based on the set coupling resistance value and performing an verification operation for verifying whether threshold voltages of the odd memory cells on which the program operation is performed are a target voltage or more.

10 Claims, 12 Drawing Sheets

METHOD OF OPERATING NONVOLATILE MEMORY DEVICE CONTROLLED BY CONTROLLING COUPLING RESISTANCE VALUE BETWEEN BIT LINE AND PAGE BUFFER

CROSS-REFERENCE TO RELATED APPLICATION

This application is a division of U.S. patent application Ser. No. 13/726,861 filed on Dec. 26, 2012, which is a division of U.S. patent application Ser. No. 12/775,552 filed on May 7, 2010, now U.S. Pat. No. 8,355,286, which claims priority to Korean patent application number 10-2009-0040134 filed on May 8, 2009 and Korean patent application number 10-2010-0039436 filed on Apr. 28, 2010. The disclosure of each of the foregoing applications is incorporated herein by reference in its entirety.

BACKGROUND

Exemplary embodiments relate to a method of operating a nonvolatile memory device and, more particularly, to a method of operating a nonvolatile memory device, which is capable of reducing an error of a read operation due to an increase in the width of the distribution of a threshold voltage.

A nonvolatile memory device includes a memory cell array and a page buffer.

The memory cell array includes a cell string having a number of memory cells coupled thereto in series, a source select transistor coupled to one terminal of the cell string, and a drain select transistor coupled to the other terminal of the cell string. For the cell strings, the memory cells arranged in a row across the cell strings are coupled to a corresponding word line. Here, the cell strings are coupled to bit lines by the drain select transistor. Furthermore, the cell strings are coupled to a common source line by the source select transistor. Meanwhile, the bit lines of the memory cell array are classified into even bit lines and odd bit lines. Cells coupled to the same word line constitute a page.

The page buffer may temporarily store data to be written in the memory cell array. Until the data temporarily stored in the page buffer is written/programmed into a selected memory cell of the memory cell array, a program operation and a verification operation are repeated for a certain number of times. The program operation is performed by supplying a program voltage to the selected memory cell in order to program the selected memory cell with a threshold voltage of a specific level or more. The verification operation is performed by supplying a verification voltage to the selected memory cell in order to verify whether the selected memory cell has been programmed with the threshold voltage of the specific level or more. When all the memory cells are programmed through the program and verification operations, the threshold voltages of the memory cells according to program states are distributed near the verification voltage.

To read data stored in a selected memory cell, a read operation is performed by supplying a read voltage to the selected memory cell to read a program state of the selected memory cell. During the read operation, the level of the read voltage to read the program state of the memory cell is determined by the width of threshold voltages' distribution according to the program state of the memory cell. In particular, in a nonvolatile memory device of a Multi-Level Cell (hereinafter referred to as 'MLC') type, the width of the distribution of threshold voltages has a great influence on the operating voltage of the memory cell as compared with a nonvolatile memory device of a Single Level Cell (hereinafter referred to as 'SLC') type having only two states "1" and "0".

FIG. 1 is a diagram illustrating the distribution of threshold voltages of a nonvolatile memory device of an MLC type.

The MLC stores 2 bits, and the MLC type nonvolatile memory device has four states; '11' (an erase state), '01' (a first program state P1), '10' (a second program state P2), and '00' (a third program state P3). The MLC type nonvolatile memory device having a number of the states requires the read voltage with plural levels for reading of the respective states. Furthermore, to maintain a stable read operation of the nonvolatile memory device a read margin for each state has to be sufficiently secured. Here, the width of the distribution of the threshold voltages for each state is a factor to determine the read margin and the read voltage level. However the width of the distribution of the threshold voltages is increased because of interference phenomenon between neighboring memory cells. Since the width of the distribution of the threshold voltages is increased, it becomes difficult to set up the read voltage level and to secure the proper read margin. Accordingly, a concern is raised in that an error occurs during the read operation of the nonvolatile memory device.

BRIEF SUMMARY

Exemplary embodiments relate to a method of operating a nonvolatile memory device, which is capable of reducing an error of a read operation due to an increase in the width of the distribution of threshold voltages.

A method of operating a nonvolatile memory device according to an embodiment of the present invention comprises determining whether a program operation is performed on even memory cells coupled to even bit lines of a selected page, setting a coupling resistance value between odd bit lines of the selected page and page buffers depending on whether the program operation for the even memory cells is programmed, performing a program operation on odd memory cells coupled to the odd bit lines, and coupling the odd bit line to the page buffer based on the set coupling resistance value and performing a verification operation for verifying whether threshold voltages of the odd memory cells on which the program operation is performed are a first target voltage or more.

A method of operating a nonvolatile memory device according to another embodiment of the present invention comprises determining whether a most significant bit (MSB) program operation is performed on even memory cells coupled to even bit lines of a selected page, setting a coupling resistance value between odd bit lines of the selected page and page buffers depending on whether the MSB program operation for the even memory cells is performed, performing a MSB program operation on odd memory cells coupled the odd bit lines, and coupling the odd bit line to the page buffer based on the set coupling resistance value and performing a MSB verification operation for verifying whether threshold voltages of the odd memory cells on which the MSB program operation is performed are a first target voltage or more.

A method of operating a nonvolatile memory device according to yet another embodiment of the present invention comprises determining whether even memory cells coupled to even bit lines and odd memory cells coupled to odd bit lines in a selected page are programmed, if, as a result of the determination, the even memory cells and the odd memory cells have not been programmed, setting a coupling resistance value between the even bit line and a page buffer to a first level coupling the even bit line to the page buffer based on the set coupling resistance value of the first level and performing the a read operation for the even memory cell, setting the coupling resistance value between the odd bit line and the page buffer to the first level coupling the odd bit line to the page buffer based on the set coupling resistance value of the first level and performing the a read operation for the odd memory cell.

In the above described exemplary embodiments, the coupling resistance value between the odd bit line and the page buffer can be set by controlling a sense control transistor configured to couple the odd bit line to the page buffer in response to a precharge voltage, to precharge the odd bit line, and to couple the odd bit line to the page buffer according to a voltage level of the odd bit line in response to a sense voltage. Furthermore, the coupling resistance value between the odd bit line and the page buffer can be increased by lowering a level of the precharge voltage, raising a level of the sense voltage, reducing a time during which the sense control transistor is turned off before the sense voltage is supplied after the precharge voltage is supplied, reducing a time during which the precharge voltage is supplied, or increasing a time during which the sense voltage is supplied.

In the exemplary embodiments, the coupling resistance value between the even bit line and the page buffer can be set by controlling a sense control transistor configured to couple the even bit line to the page buffer in response to a precharge voltage, to precharge the even bit line, and to couple the even bit line to the page buffer according to a voltage level of the even bit line in response to a sense voltage. Furthermore, the coupling resistance value between the even bit line and the page buffer can be increased by lowering a level of the precharge voltage, raising a level of the sense voltage, reducing a time during which the sense control transistor is turned off before the sense voltage is supplied after the precharge voltage is supplied, reducing a time during which the precharge voltage is supplied, or increasing a time during which the sense voltage is supplied.

DESCRIPTION OF EMBODIMENTS

Hereinafter, exemplary embodiments of the present disclosure will be described in detail with reference to the accompanying drawings. The figures are provided to facilitate understanding of the exemplary embodiments of the disclosure by those of ordinary skill in the art.

Figure 2:
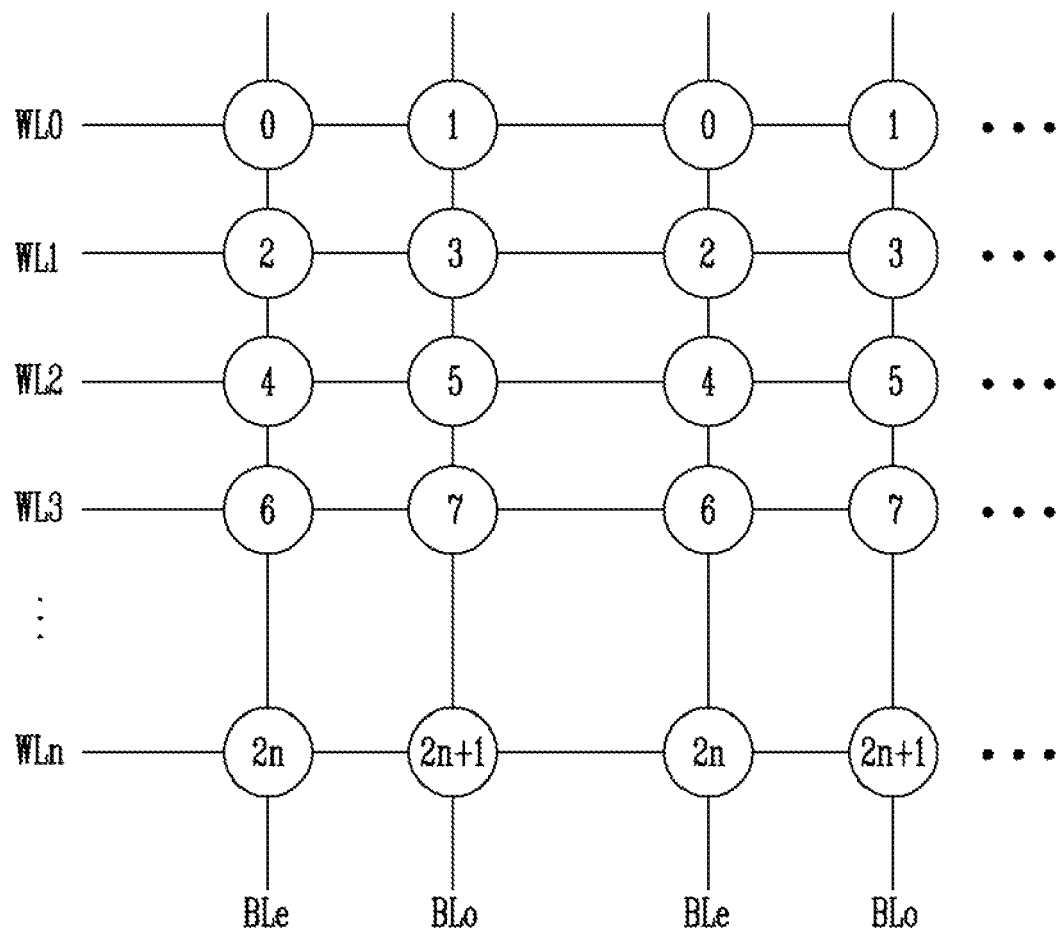
FIG. 2 is a diagram illustrating a memory cell array of a nonvolatile memory device.

FIG. 2 is a diagram illustrating a memory cell array of a nonvolatile memory device.

FIG. 2 shows a program sequence of a memory cell array. As shown in FIG. 2, in general, the nonvolatile memory device is programmed with a specific directivity.

For example, after an even page 0 of a word line WL0 is programmed, an odd page 1 of the word line WL0 is programmed. Next, after an even page 2 of a word line WL1 is programmed, an odd page 3 of the word line WL1 is programmed. The program operation is sequentially performed as described above. After an even page 2n of a word line WLn (i.e., the last word line) is programmed, an odd page 2n+1 of the word line WLn is programmed. Here, an even page of a word line includes memory cells of the word line coupled to an even bit line BLe, and an odd page of a word line includes memory cells of the word line coupled to an odd bit line BLo.

Figure 3A:
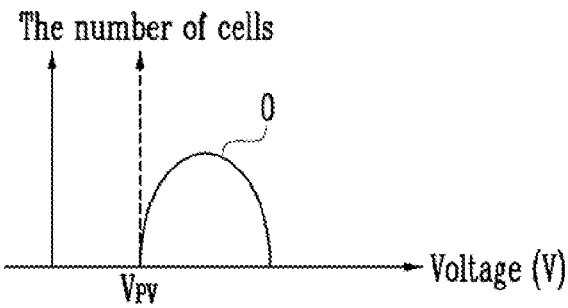
FIGS. 3A-3H and 4A-4B are diagrams illustrating an increase in the width of the distribution of threshold voltages of the nonvolatile memory device shown in FIG. 2.
Figure 3B:
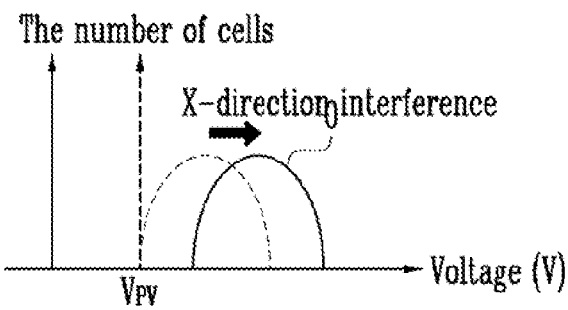
Figure 3C:
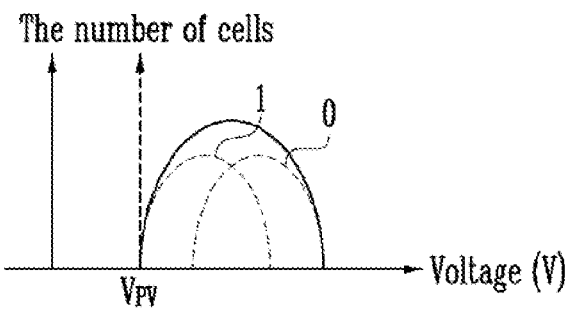
Figure 3D:
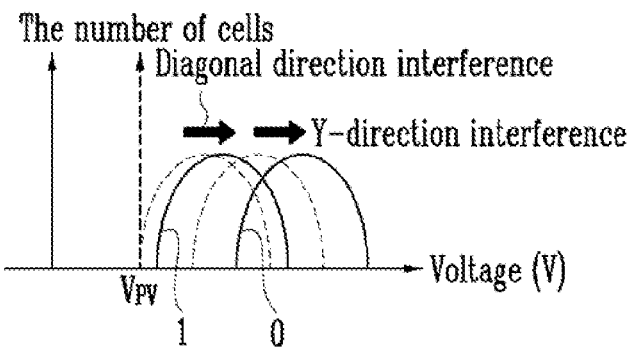
Figure 3E:
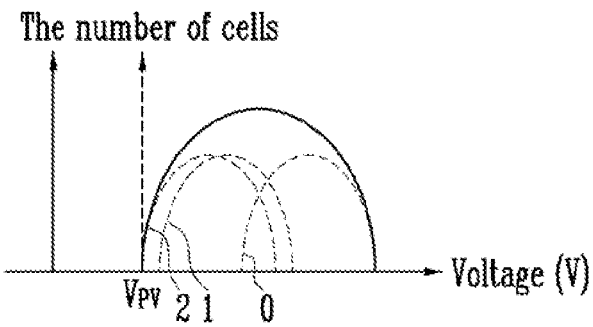
Figure 3F:
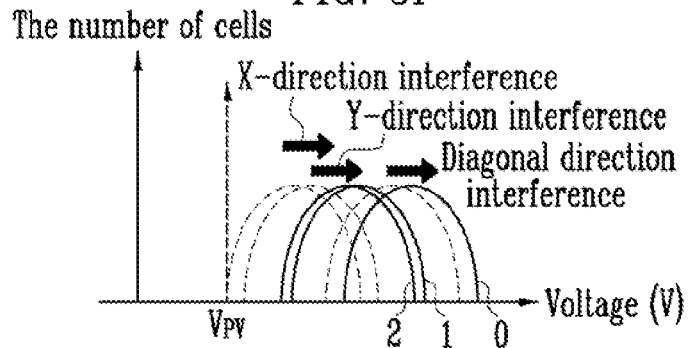
Figure 3G:
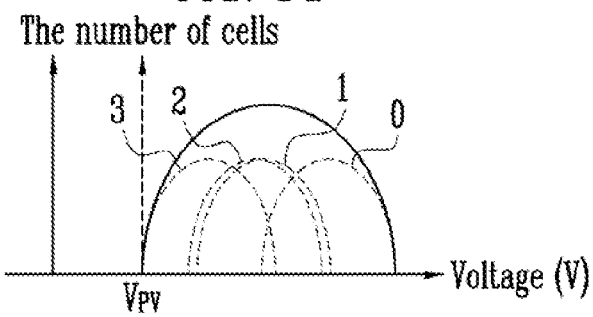
Figure 3H:
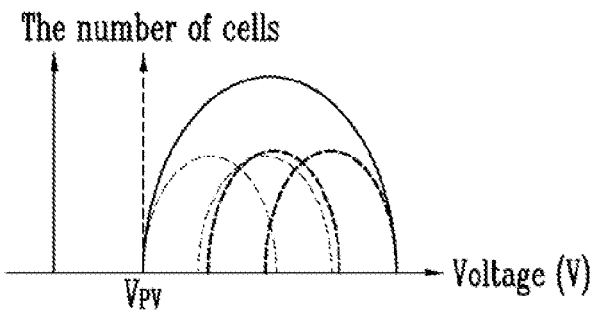

FIGS. 3A and 3H are diagrams illustrating an increase in the width of the distribution of threshold voltages in the case in which a program operation is performed according to the program sequence shown in FIG. 2.

First, memory cells, constituting the even page 0 of the word line WL0, are programmed with a verification voltage Vpv or more to have the distribution of threshold voltages shown in FIG. 3A. However, the threshold voltages of the memory cells rise as shown in FIG. 2B, because of the interference phenomenon occurring when memory cells constituting the odd page 1 of the word line WL0 are programmed with the verification voltage Vpv or more according to the program sequence. Here, the interference phenomenon due to a program operation for a page adjacent in the word line direction is called X-direction interference. As a result, because of the X-direction interference, the threshold voltages of the memory cells constituting the even and odd pages 0 and 1, which are programmed with the verification voltage Vpv or more, have the widened distribution as shown in FIG. 3C.

Next, as shown in FIG. 3D, the threshold voltages of the memory cells, constituting the pages 0, 1 which have already been programmed, further rise because of the interference phenomenon occurring when the even page 2 of the word line WL1 is programmed. Here, the interference phenomenon due to a program operation for a page adjacent in the bit line direction is called Y-direction interference. Furthermore, the interference phenomenon due to a program operation for a page diagonally adjacent is called diagonal direction interference. Because of the Y direction interference and the diagonal direction interference, the widths of the distributions of threshold voltage of the memory cells constituting the pages 0, 1, and 2, which are programmed with the verification voltage Vpv or more, are further increased as shown in FIG. 3E.

Referring to FIG. 3F, the threshold voltages of the memory cells, constituting the pages 0, 1, and 2 which have already been programmed, rise because of interference occurring when the odd page 3 of the word line WL1 is programmed.

Here, the widths of the distributions of threshold voltages of the memory cells constituting the page 0, 1, 2, and 3, which are programmed with the verification voltage Vpv or more, are further increased because of the X-direction interference, the Y-direction interference, and the diagonal direction interference, as shown in FIG. 3G.

In the case in which program operations are performed with a specific directivity as described above, the threshold voltages of memory cells of a page which has already been programmed rise because of the interference phenomenon according to subsequent program operations. Consequently, as the memory cells constituting the word lines WL0 to WLn are programmed, the distribution of the threshold voltages of the memory cells widens, as shown in FIG. 3H.

Figure 4A:
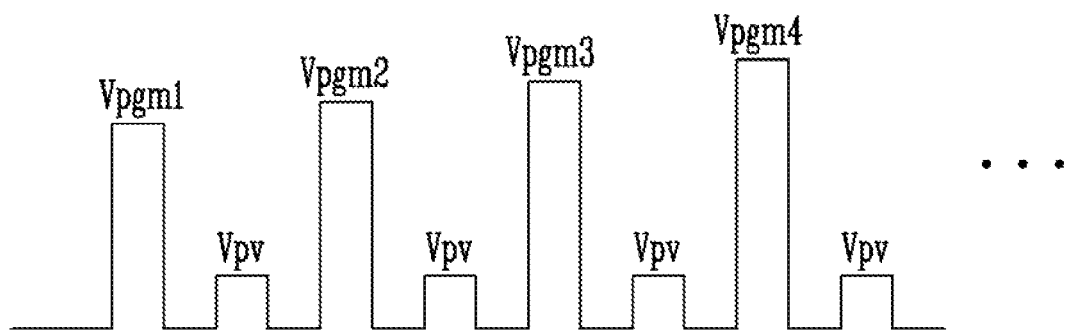
Figure 4B:
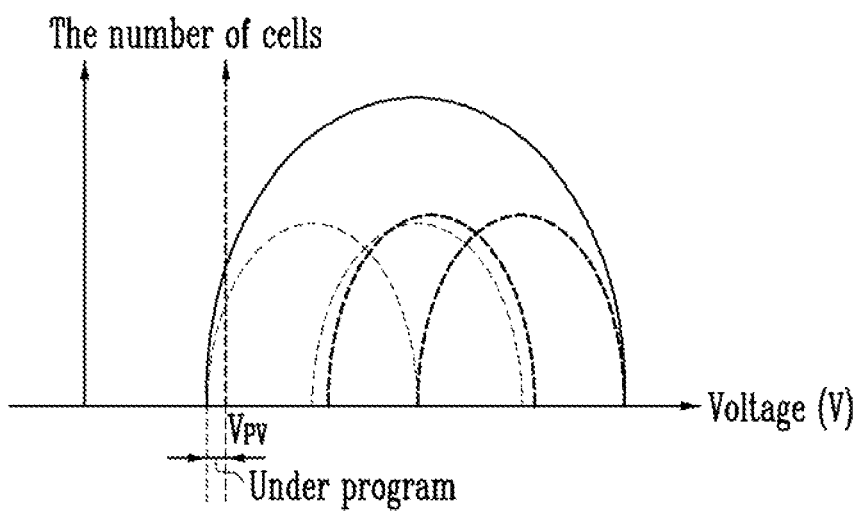

FIGS. 4A and 4B are diagrams illustrating an increase in the width of a distribution of the threshold voltages due to a different reason.

To program the memory cells of a nonvolatile memory device, a program operation and a verification operation are repeated in accordance with an incremental step pulse program (ISPP) method as shown in FIG. 4A. Here, the program operation is performed on the memory cells determined to be programmed through the verification operation. Whenever the program operation is repeated, a program voltage Vpgm is increased by a certain step voltage. The verification operation is performed in order to verify whether each program operation according to an increased program voltage is a pass.

In the case in which all the memory cells constituting all the pages of a selected word line are programmed, some memory cells, i.e., fast program cells, are programmed at the early stage in which the program operation is performed in accordance with the ISPP method. If the verification operation is performed in this state, the remaining bit lines, other than a small number of bit lines coupled to the programmed memory cells, are discharged from a precharge level to a ground voltage level. Here, the voltage of a common source line rises because of its resistance, and so the source voltages of the fast program cells also rise. Consequently, such a noise of the common source line reduces the sense currents of the fast program cells. The fast program cells having the reduced sense currents pass the verification operation even though they have threshold voltages lower than the verification voltage Vpv, and so a program operation is no longer performed. The distribution of the threshold voltages of memory cells which are programmed may be formed at a point lower than the verification voltage Vpv as shown in FIG. 4B, which increases the width of the distribution of the threshold voltages and prevents such memory cells from being considered as under-programmed cells.

This method of operating a nonvolatile memory device according to an exemplary embodiment of the present invention is capable of reducing an error of a read operation due to an increase in the width of the distribution of threshold voltages, caused by the interference phenomena and the under-programmed cells as described above.

Figure 5:
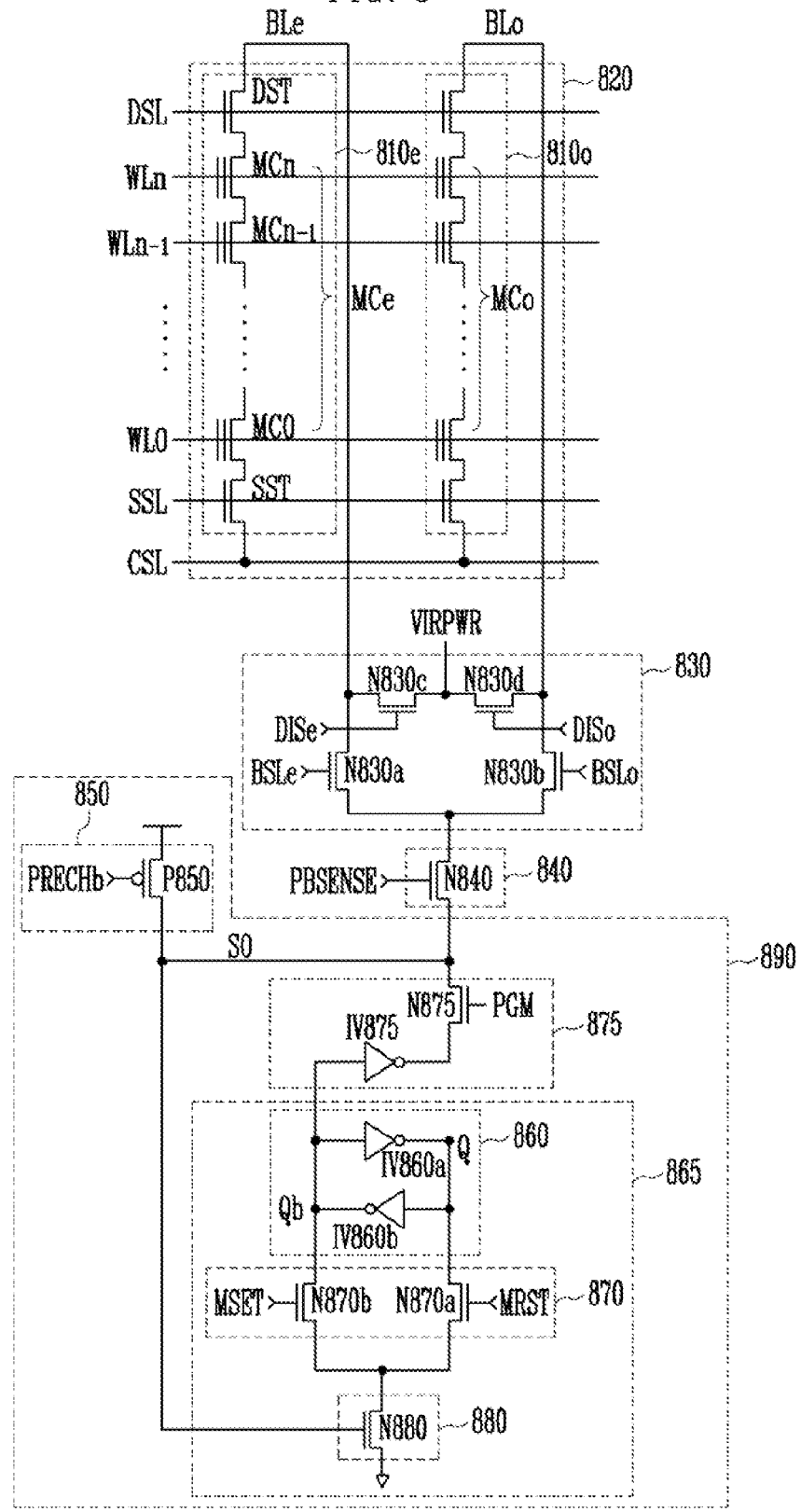
FIG. 5 is a diagram illustrating a nonvolatile memory device in accordance with an embodiment of the present invention.

FIG. 5 is a diagram illustrating a nonvolatile memory device in accordance with an embodiment of the present invention.

Referring to FIG. 5, the nonvolatile memory device according to the exemplary embodiment includes a memory cell array 820, a bit line selection unit 830, sense control unit 840, and a page buffer 890.

The memory cell array 820 includes a number of strings 810e, 810o coupled between a common source line CSL and respective bit lines BLe, BLo. Each of the strings 810e, 810o includes a number of memory cells MC0 to MCn coupled in series between a drain select transistor DST and a source select transistor SST. Here, the bit lines BLe, BLo are classified into the even bit line BLe and the odd bit line BLo. Furthermore, a number of the strings 810e, 810o are classified into the even string 810e coupled to the even bit line BLe and the odd string 810o coupled to the odd bit line BLo. Here, the memory cells constituting the even string 810e are referred to as an even memory cell MCe, and the memory cells constituting the odd string 810o are referred to as an odd memory cell MCo.

The drain select transistors DST couple the string 810e (810o) and the bit line BLe (BLo) together. The source select transistors SST couple the string 810e (810o) and the common source line CSL together. The drain select transistors DST are coupled to a drain selection line DSL. The source select transistors SST are coupled to a source selection line SSL. Furthermore, the memory cells MC0 to MCn are coupled to word lines WL0 to WLn arranged in parallel between the source selection line SSL and the drain selection line DSL. A number of the strings 810e, 810o coupled to the respective bit lines BLe, BLo are coupled to the common source line CSL in parallel, thus constituting a block.

The bit line selection unit 830 is coupled to the bit lines BLe and BLo between the memory cell array 820 and the sense control unit 840. The bit line selection unit 830 can be coupled to one or more of the bit lines BLe, BLo. In the exemplary embodiment, the bit line selection unit 830 is illustrated to be coupled to a pair of the even and odd bit lines BLe and no.

The bit line selection unit 830 includes NMOS transistors N830a and N830b for coupling the respective bit lines BLe/BLo and the sense control unit 840 in response to respective bit line selection signals BSLe and BSLo. The bit line selection unit 830 further includes a control signal input terminal for supplying a control signal VIRPWR of a specific level and NMOS transistors N830c and N830d for coupling the respective bit lines BLe/BLo and the control signal input terminal in response to respective discharge signals DISe and DISo. The bit line selection unit 830 precharges a selected bit line to a relatively high level or discharges the selected bit line to a relatively low level in response to a voltage level of the control signal VIRPWR inputted to the control signal input terminal.

The sense control unit 840 includes a sense control transistor N840. The sense control transistor N840 couples a bit line, selected by the bit line selection unit 830, to the page buffer 890 in response to a bit line sense signal PBSENSE and controls a coupling resistance value between the selected bit line and the page buffer 890.

The page buffer 890 latches data to be programmed into a selected memory cell or reads data stored in a selected memory cell and stores the read data. To this end, the page buffer 890 includes a sense node SO, a sense node precharge unit 850, and a latch unit 865.

The sense node precharge unit 850 couples the sense node SO to a power source voltage input terminal, thus precharging the sense node SO to a high level. The sense node precharge unit 850 includes a PMOS transistor P850 for coupling the sense node SO and the power source voltage input terminal together in response to a precharge signal PRECHb of a logic low level. The sense node SO is coupled to a bit line, selected by the sense control transistor N840 turned on in response to the bit line sense signal PBSENSE, thus detecting a shift in the voltage level of the selected bit line.

The latch unit 865 includes a latch 860, a data set unit 870, and a sense node sense unit 880.

The latch 860 temporarily stores data to be programmed into a selected memory cell or temporarily stores data read from a selected memory cell. To this end, the latch 860 has the output terminal of a first inverter IV860a coupled to the input terminal of a second inverter IV860b and has the output terminal of the second inverter IV860b coupled to the input terminal of the first inverter IV860a. Here, a node where the output terminal of the first inverter IV860a and the input terminal of the second inverter IV860b are coupled together is called a first node Q. A node where the output terminal of the second inverter IV860b and the input terminal of the first inverter IV860a are coupled together is called a second node Qb.

The data set unit 870 inputs data to the latch 860. To this end, the data set unit 870 includes a first data set transistor N870a and a second data set transistor N870b. The first data set transistor N870a couples the sense node sense unit 880 and the first node Q together in response to a first data set signal MIST. The second data set transistor N870b couples the sense node sense unit 880 and the second node Qb together in response to a second data set signal MSET.

The sense node sense unit 880 includes an NMOS transistor N880. The NMOS transistor N880 couples the data set unit 870 and a ground terminal together in response to a voltage level of a selected bit line, detected through the sense node SO. The NMOS transistor N880 of the sense node sense unit 880 supplies the data set unit 870 with voltage of the ground terminal when the voltage level of the sense node SO is a relatively high level.

Meanwhile, the page buffer 890 may include a data transfer unit 875 coupled between the sense node SO and the latch 860. The data transfer unit 875 includes an inverter IV875 and a transfer transistor N875. The inverter IV875 inverts a signal of the second node Qb and outputs an inverted signal. The transfer transistor N875 couples the output terminal of the inverter IV875 to the sense node SO in response to a program signal PGM.

Figure 6:
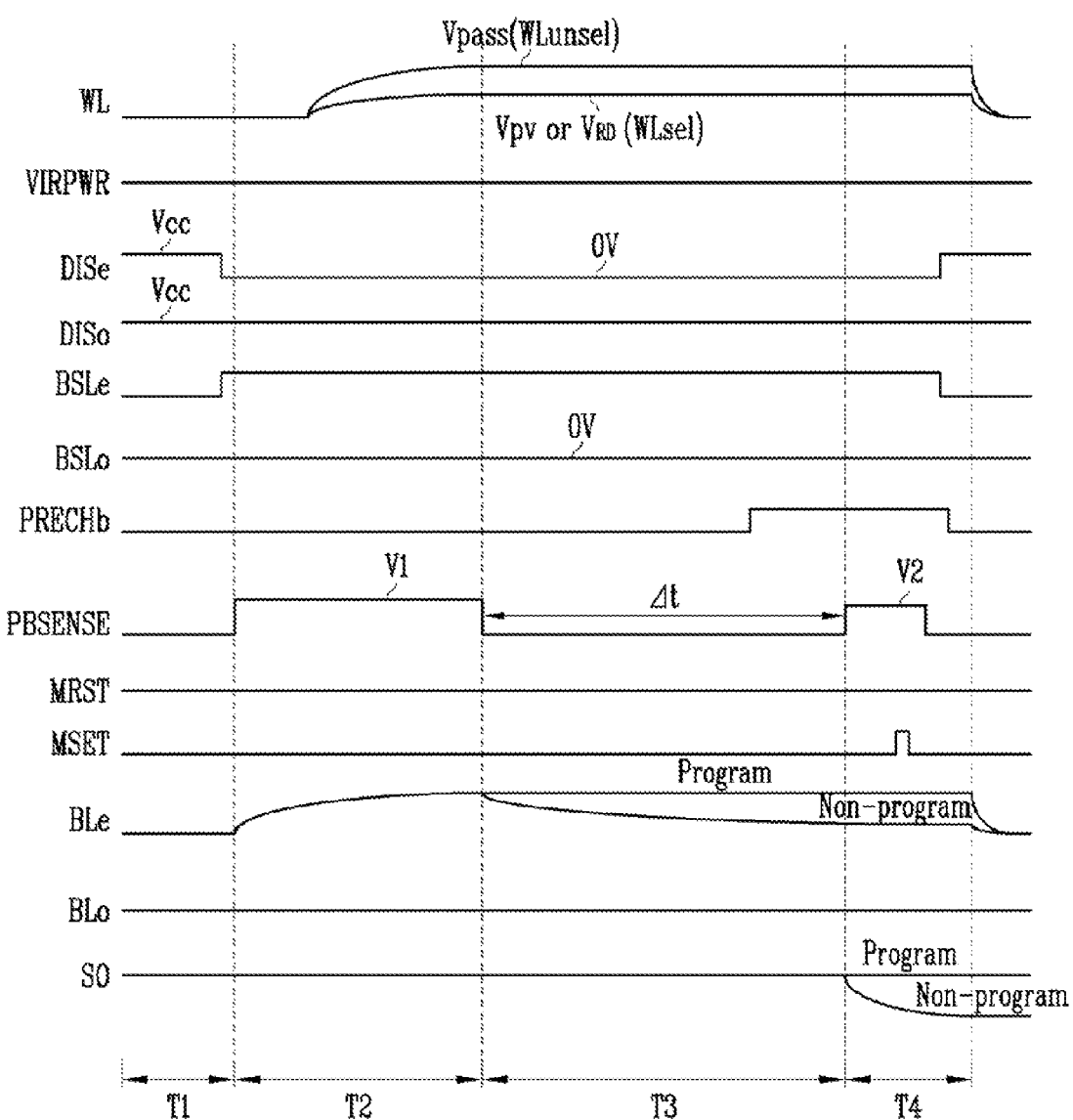
FIG. 6 shows waveforms illustrating a method of operating the nonvolatile memory device in accordance with an the embodiment of the present invention.

FIG. 6 shows waveforms illustrating a method of operating the nonvolatile memory device in accordance with an embodiment of the present invention. In particular, FIG. 6 shows waveforms illustrating a verification operation or a read operation of the nonvolatile memory device.

The verification operation or the read operation is performed during first to fourth periods T1, T2, T3, and T4 to be described later.

(1) A First Period T1: A Bit Line Discharge Period.

During the first period T1, the discharge signals DISe and DISo are enabled.

During the time for which the discharge signals DISe and DISo are supplied, the bit line selection signals BSLe and BSLo of a logic low level are supplied in order to cut off the connection between the bit lines BLe and BLo and the sense control unit 840.

Furthermore, the PMOS transistor P850 is turned on in response to the precharge signal PRECHb of a logic low level, and so the sense node SO is precharged to a power source voltage level.

(2) A Second Period T2: A Bit Line Precharge Period.

During the second period T2, a power source voltage (e.g., 4.5V) is supplied to the drain selection line DSL to turn on the drain select transistor DST. Furthermore, a selected bit line (e.g., BLe) is precharged to a high level. To precharge the selected even bit line BLe to a high level, the even discharge signal DISe shifts to a logic low level and the even bit line selection signal BSLe shifts to a logic high level, thereby coupling the sense control unit 840 and the even bit line BLe together. Meanwhile, since the odd bit line selection signal BSLo maintained at a logic low level supplied during the second period T2, the connection between the sense control unit 840 and an unselected odd bit line BLo is cut off.

Furthermore, since the bit line sense signal PBSENSE having a level of a precharge voltage V1 is supplied to the sense control unit 840, the even bit line BLe is precharged to a voltage level V1-Vt in which a threshold voltage Vt of the sense control transistor N840 is subtracted from the precharge voltage V1.

Meanwhile, during the second period T2, a verification voltage Vpv or a read voltage $V_{RD}$ is supplied to a selected word line WLsel coupled to a selected memory cell. The verification voltage Vpv is supplied for a verification operation which is performed in a process of writing data into the selected memory cell. The read voltage $V_{RD}$ is supplied in order to read data stored in the selected memory cell. Furthermore, during the second period T2, a pass voltage Vpass is supplied to unselected word line WLunsel coupled to the remaining unselected memory cells other than the selected memory cell.

(3) A Third Period T3: An Evaluation Period.

After the selected bit line BLe is precharged to a specific voltage level, whether the selected memory cell has been programmed is evaluated based on a shift in the voltage level of the selected bit line BLe during the third period T3. Meanwhile, during this period, a power source voltage (e.g., 4.5V) is supplied to the source selection line SSL in order to turn on the source select transistor DST. Accordingly, the string 810e and the common source line CSL from which a ground voltage is supplied are coupled together, and a current path from the selected bit line BLe to the common source line CSL is formed.

To evaluate whether the selected memory cell has been programmed, the sense signal PBSENSE shifts to a logic low level to disconnect the selected bit line BLe from the sense node SO. During this period, a voltage level of the selected bit line BLe is changed according to whether the selected memory cell has been programmed.

More particularly, if the selected memory cell has been programmed with a threshold voltage higher than the verification voltage Vpv or the read voltage $V_{RD}$, the selected memory cell is not turned on although the verification voltage Vpv or the read voltage $V_{RD}$ is supplied thereto. Accordingly, the selected bit line BLe maintains the voltage level V1-Vt. However, if the selected memory cell has not been programmed with a threshold voltage higher than the verification voltage Vpv or the read voltage $V_{RD}$, the selected memory cell is turned on at the verification voltage Vpv or the read voltage $V_{RD}$. Accordingly, a current path is formed through the string 810e, and the selected bit line BLe shifts to a low level.

(4) A Fourth Period T4: A Sense Period.

During the fourth period T4, whether the selected memory cell has been programmed is determined by detecting a shift in the voltage level of the selected bit line BLe. Meanwhile, before the fourth period T4 is entered, the precharge signal PRECHb shifts from a logic low level to a logic high level to disconnect the sense node SO from the power source voltage input terminal.

Furthermore, the sense signal PBSENSE, having a level of a sense voltage V2 lower than the precharge voltage V1, is supplied to the sense control unit 840.

In the case in which the selected memory cell has been programmed and so the selected bit line BLe maintains the voltage level V1-Vt the sense node SO remains in a relatively high level because a switching element N840 is not turned on.

However, in the case in which the selected memory cell has not been programmed, and so the selected bit line BLe does not maintain the voltage level V1-Vt, but shifts to a low level, the switching element N840 is turned on. Accordingly, charges stored in the sense node SO are drained to the selected bit line BLe, and so the sense node SO is discharged to a relatively low level.

Next, the second data set transistor N870b of the data set unit 870 is turned on in response to the second data set signal MSET of a logic high level. Here, when the sense node SO remains in a relatively high level voltage, the NMOS transistor N880 of the sense node sense unit 880 is turned on. Accordingly, when the selected memory cell is in a programmed state, the ground voltage is supplied to the second node Qb through the sense node sense unit 880.

Meanwhile, in the verification operation or the read operation, whether a selected memory cell has been programmed is determined on the basis of a sense current of the page buffer for detecting a shift in the voltage level of a selected bit line according to the turn-on/off of the selected memory cell. Accordingly, even if a voltage level of the selected bit line is maintained to a specific value, coupling resistance value between the selected bit line and the sense node SO is controlled by the sense node sense unit 880 a sense current of the page buffer in response to a verification voltage or a read voltage having the same level can be changed. Thus, determining whether the selected memory cell has been programmed can be controlled.

A level of the sense current is expressed using the following equation 1.

$$Icell=(C_{BL}\times(V1-V2))/\Delta t \quad \text{[Equation 1]}$$

where Icell: the sense current, $C_{BL}$: capacitance of the selected bit line, V1: the precharge voltage, V2: the sense voltage, and $\Delta t$: the interval of the second period T2

Here, if the level of the sense current to detect a voltage level of the selected bit line is lowered by raising the coupling resistance value between the selected bit line and the sense node using the sense control unit 840, a threshold voltage of the selected memory cell can be detected to be lower than when the level of the sense current is relatively high. Furthermore, if the verification operation is performed by lowering the level of the sense current by raising the coupling resistance value between the selected bit line and the sense node SO using the sense control unit, irrespective of an interference phenomenon, the width of a distribution of the threshold voltage can be controlled and reduced near the verification voltage compared to that when the level of the sense current is relatively high. This is because, if the selected memory cell is programmed in accordance with the ISPP method using a verification operation with a lowered level of the sense current, an increment of the threshold voltage according to an increment of the program voltage can be minutely controlled as compared with when the level of the sense current is high. A method of operating a nonvolatile memory device according to the above described phenomenon is described below.

Figure 7:
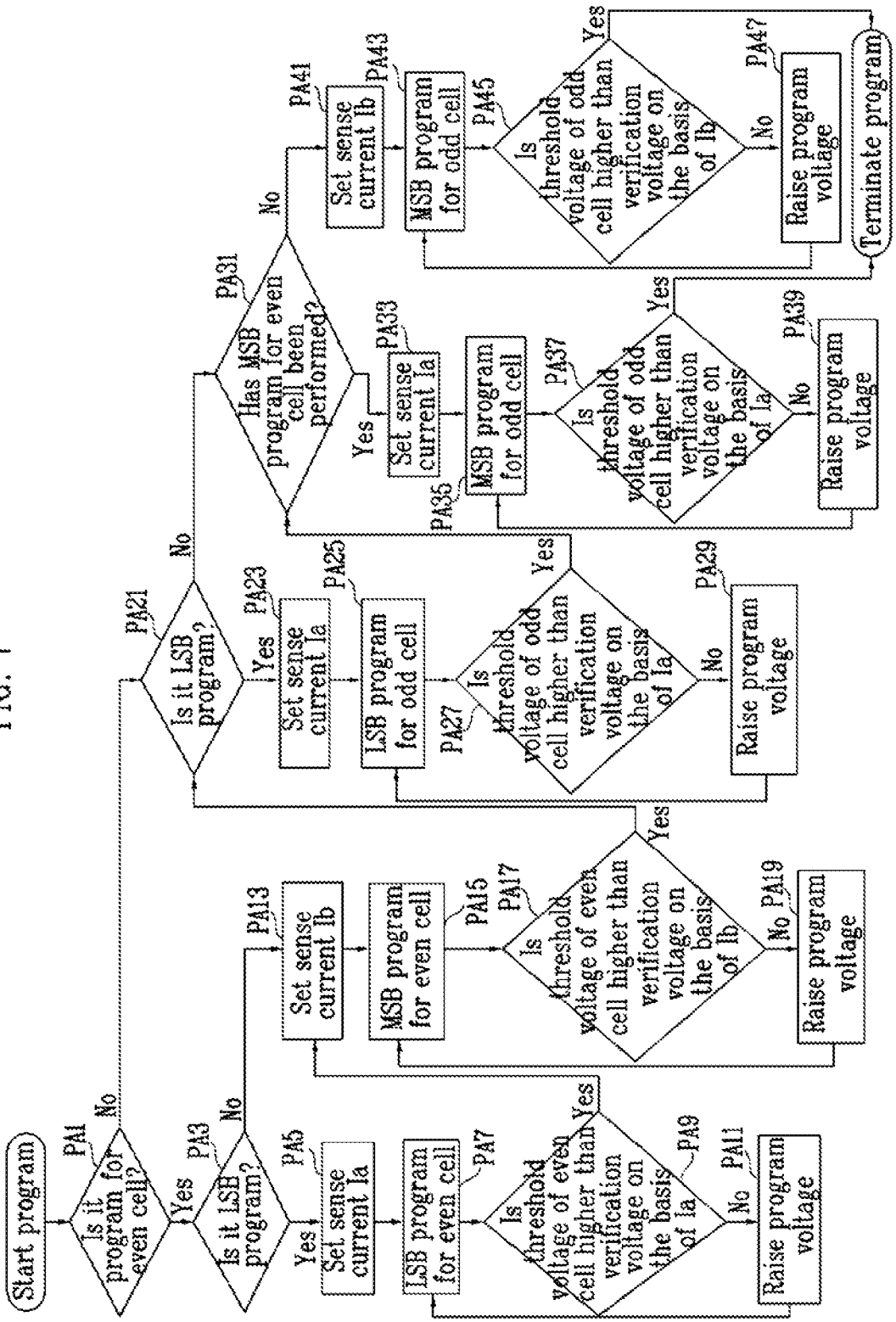
FIG. 7 is a flowchart illustrating a method of operating a nonvolatile memory device according to an embodiment of the present invention.

FIG. 7 is a flowchart illustrating a method operating a nonvolatile memory device according to an embodiment of the present. More particularly, FIG. 7 is a flowchart illustrating a program method in the operation of the nonvolatile memory device according to the exemplary embodiment.

If, as described above, the lowered sense current is used during the verification operation for a program, the page buffer verifies the threshold voltage of the selected memory cell to be at a lower level than that when the level of the sense current is high. Accordingly, a selected memory cell, which can be determined to have been programmed with a target voltage or more using the sense current of a high level, may be determined not to have been programmed with the target voltage using the sense current of a low level. Accordingly, more pulses of the program voltage according to the ISPP method can be supplied to the selected memory cell. Consequently, more electrons are to be injected into the selected memory cell when the program is performed through the verification operation using the sense current of a low level than a high level. Accordingly, if all the memory cells constituting the memory block are programmed using the sense current of a low level, an interference phenomenon becomes worse, and so the width of a distribution of the threshold voltages can be increased. In the embodiment of the present invention, a verification operation for a program is performed using a sense current of a first level and a second level lower than the first level. Accordingly, an embodiment for minimizing interference phenomena and, at the same time, reducing the width of a distribution of the threshold voltages of memory cells is provided.

Figure 1:
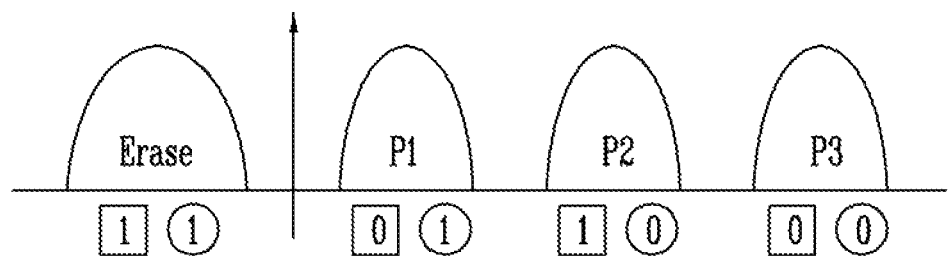
FIG. 1 is a diagram illustrating the distribution of threshold voltages of a nonvolatile memory device of an MLC type.

Hereinafter, in the embodiment of the present invention, a method of operating a nonvolatile memory device of an MLC type in which one memory cell stores 2-bit data and has four states (e.g. erase, P1, P2, and P3 as shown in FIG. 1) is described as an example.

A program operation of the 2-bit memory cell is classified into a least significant bit (hereinafter referred to as an 'LSB') program operation and a most significant bit (hereinafter referred to as an 'MSB') program operation. Furthermore, after the LSB program operation is performed on the 2-bit memory cell, the MSB program operation is performed on the 2-bit memory cell.

When the LSB program operation is performed on the 2-bit memory cell in the erase state (refer to Erase in FIG. 1) in which an LSB data and an MSB data are '11', the memory cell has the state '11' or the state '10'. Next, when the MSB program operation is performed on the 2-bit memory cell, the memory cell (i.e., the state '10') is programmed with the state '00' and the state '10', and the memory cell (i.e., the state '11') is programmed with the state '01'.

Meanwhile, in the case in which all the memory cells coupled to the same word line are programmed, the even page including the even memory cell MCe coupled to the even bit line BLe is programmed earlier than the odd page including the odd memory cell MCo coupled to the odd bit line BLo. Accordingly, during a program operation for an odd page, the threshold voltage of the even memory cell MCe which have been programmed rises under the influence of the odd page program operation, thereby increasing the width of a distribution of the threshold voltage. However, if the width of a distribution of the threshold voltage of the even memory cell MCe is reduced during an even page program operation, although the threshold voltage of the even memory cell MCe rise in a subsequent odd page program operation, the width of a distribution of the threshold voltage of the even memory cell MCe can be reduced.

In the case in which the odd memory cell MCo of the odd page MCo has been programmed, but the even memory cell MCe of the even page MCe has not been programmed, the width of a distribution of the threshold voltage of the programmed odd page MCo can be reduced by reducing the distribution of the threshold voltage of the odd memory cell MCo. Furthermore, in the case in which the even memory cell MCe of the even page has been programmed, but the odd memory cell MCo of the odd page has not been programmed, the width of a distribution of the threshold voltage of the programmed even memory cell MCe can be reduced by reducing the distribution of the threshold voltage of the programmed even memory cell MCe.

As described above, in the embodiment of the present invention, in order to reduce the width of the distribution of threshold voltages of programmed memory cells, when program data to be programmed into memory cells coupled to a selected word line is received, it is first determined whether a program operation for a selected memory cell is for an even memory cell MCe at step PA1, as shown in FIG. 7. If, as a result of the determination, the program operation for the selected memory cells is determined to be for the even memory cell MCe, it is determined whether the program operation is an LSB program operation at step PA3. If, as a result of the determination at step PA3, the program operation is determined to be the LSB program operation, a sense current is set to a first level Ia at step PA5. Next, at step PA7, the LSB program operation is performed on the even memory cell MCe by supplying a program voltage to a selected memory cell. At step PA9, it is then determined whether a threshold voltage of the even memory cell MCe is higher than a verification voltage on the basis of the sense current of the first level Ia. If, as a result of the determination at step PA9, the threshold voltage of the even memory cell MCe is determined not to be higher than the verification voltage, the program voltage is raised by a step voltage at step PA11. Next, the step PA7 is repeated using the program voltage increased by the step voltage. The steps PA7 to PA11 are repeated for a predetermined number of times until the threshold voltage of the even memory cell MCe becomes higher than the verification voltage at step PA9.

If, as a result of the determination at step PA9, the threshold voltage of the even memory cell MCe is determined to be higher than the verification voltage, the sense current is set to a second level Ib lower than the first level Ia at step PA13. Next, at step PA15, an MSB program operation is performed on the even memory cell MCe by supplying the program voltage to a selected memory cell. At step PA17, it is then determined whether a threshold voltage of the even memory cell MCe is higher than the verification voltage on the basis of the sense current of the second level Ib. If, as a result of the determination at step PA17, the threshold voltage of the even memory cell MCe is determined not to be higher than the verification voltage, the program voltage is raised by a step voltage at step PA19. Next, the step PA15 is repeated using the program voltage raised by the step voltage. The steps PA15 to PA19 are repeated for a predetermined number of times until the threshold voltage of the even memory cell MCe becomes higher than the verification voltage at step PA17.

Meanwhile, as a result of the determination at step PA1, the program operation for selected memory cells is determined not to be for an even memory cell MCe or, as a result of the determination at step PA17, the threshold voltage of the even memory cell MCe is determined to be higher than the verification voltage, it is determined whether the program operation is the LSB program operation at step PA21. If, as a result of the determination, the program operation is determined to be the LSB program operation, the sense current is set to the first level Ia at step PA23. Next, at step PA25, the LSB program operation is performed on the odd memory cell MCo by supplying the program voltage to a selected memory cell. At step PA27, it is then determined whether a threshold voltage of the odd memory cell MCo is higher than the verification voltage on the basis of the sense current of the first level Ia. If, as a result of the determination, the threshold voltage of the odd memory cell MCo is determined not to be higher than the verification voltage, the program voltage is raised by a step voltage at step PA29. The step PA25 is repeated using the program voltage raised by the step voltage. The steps PA25 to PA29 are repeated for a predetermined number of times until the threshold voltage of the odd memory cell MCo becomes higher than the verification voltage at step PA27.

If, as a result of the determination at step PA27, the threshold voltage of the odd memory cell MCo is determined to be higher the verification voltage, it is determined whether an MSB program operation has been performed on the even memory cell MCe coupled to a selected word line at step PA31. Whether an LSB program operation or an MSB program operation has been performed on a specific memory cell can be determined on the basis of data stored in a flag cell (not shown) electrically coupled to the specific memory cell. If, as a result of the determination at step PA31, the MSB program operation is determined to have been performed on the even memory cell MCe, a sense current is set to the first level Ia at step PA33. Next, at step PA35, the MSB program operation is performed on the odd memory cell MCo by supplying the program voltage to a selected memory cell. At step PA37, it is then determined whether a threshold voltage of the odd memory cell MCo is higher than the verification voltage on the basis of the sense current of the first level Ia. If, as a result of the determination, the threshold voltage of the odd memory cell MCo is determined not to be higher than the verification voltage, the program voltage is raised by a step voltage at step PA39. The step PA35 is repeated using the program voltage raised by the step voltage. The steps PA35 to PA39 are repeated for a predetermined number of times until the threshold voltage of the odd memory cell MCo becomes higher than the verification voltage at step PA37.

However, if, as a result of the determination at step PA31, the MSB program operation is determined not to have been performed on the even memory cell MCe, the sense current is set to the second level Ib at step PA41. Next, at step PA43, the MSB program operation is performed on the odd memory cell MCo by supplying the program voltage on a selected memory cell. At step PA45, it is determined whether a threshold voltage of the odd memory cell MCo is higher than the verification voltage on the basis of the sense current of the second level Ib. If, as a result of the determination, the threshold voltage of the odd memory cell MCo is determined not to be higher than the verification voltage, the program voltage is raised by a step voltage at step PA47. The step PA43 is repeated using the program voltage raised by the step voltage. The steps PA43 to PA47 are repeated for a predetermined number of times until the threshold voltage of the odd memory cell MCo becomes higher than the verification voltage at step PA45.

If, as a result of the determination at steps PA37 and PA45, the threshold voltage of the odd memory cell MCo is determined to be higher than the verification voltage, the program operation on the memory cells coupled to the selected word line is terminated.

The level of a sense current can be lowered by raising coupling resistance value between a selected bit line and the sense node SO using the sense node sense unit 880 during a verification operation. The coupling resistance value between the selected bit line and the sense node SO can be adjusted by controlling a level of the precharge voltage (V1 in FIG. 6), a level of the sense voltage (V2 in FIG. 6), the interval (Δt in FIG. 6) of the second period (T2 in FIG. 6) (i.e., the bit line precharge period), the time during which the precharge voltage (V1 in FIG. 6) is supplied, or the time during which the sense voltage (V2 in FIG. 6) is supplied.

Figure 8A:
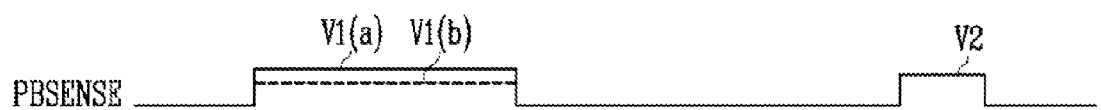
FIGS. 8A to SE show waveforms of voltages which are used at an operation of the nonvolatile memory device according to an embodiment of the present invention.

More particularly, in the case in which the verification operation is performed using a sense current of the second level Ib as shown in FIG. 8A, a level of the precharge voltage V1 is set lower than that when the verification operation is performed using the sense current of the first level Ia. That is, in the case in which the verification operation is performed using the sense current of the first level Ia, the precharge voltage V1 of a first level V1(a) is supplied. Furthermore, in the case in which the verification operation is performed using the sense current of the second level Ib, the precharge voltage V1 of a second level V1(b) lower than the first level V1(a) is supplied.

Figure 8B:

Referring to FIG. 8B, a level of the sense voltage V2 is set higher in the case in which the verification operation is performed using the sense current of the second level Ib than in the case in which the verification operation is performed using the sense current of the first level Ia. That is, in the case in which the verification operation is performed using the sense current of the first level Ia, the sense voltage V2 of a first level V2(a) is supplied.

Furthermore, in the case in which the verification operation is performed using the sense current of the second level Ib, the sense voltage V2 of a second level V2(b) higher than the first level V2(a) is supplied.

Figure 8C:
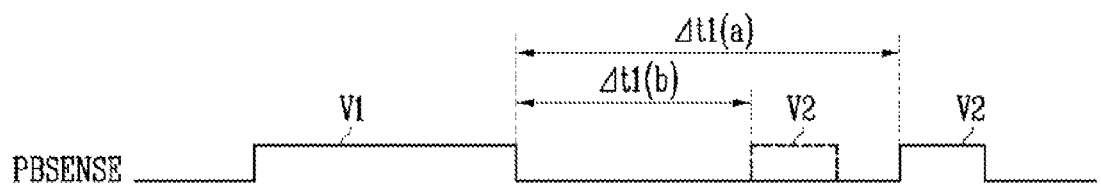

In one or more embodiments, as shown in FIG. 8C, the interval of the bit line precharge period is set to be shorter in the case in which the verification operation is performed using the sense current of the second level Ib than in the case in which the verification operation performed using the sense current of the first level Ia. That is, in the case in which the verification operation is performed using the sense current of the first level Ia, a period from a point of time at which the supply of the precharge voltage V1 is ended to a point of time at which the supply of the sense voltage V2 is started is set to a first time $\Delta t1(a)$. Furthermore, in the case in which the verification operation is performed using the sense current of the second level Ib, a period from a point of time at which the supply of the precharge voltage V1 is ended to a point of time at which the supply of the sense voltage V2 is started is set to a second time $\Delta t1(b)$ shorter than the first time $\Delta t1(a)$.

Figure 8D:
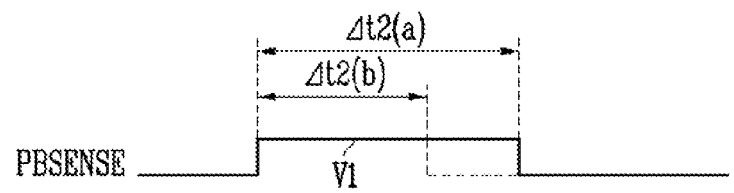

In one or more embodiments, as shown in FIG. 8D, a time $\Delta t2(b)$ during which the precharge voltage V1 is supplied to perform a verification operation on the basis of the sense current of the second level Ib is set to be shorter than a time $\Delta t2(a)$ during which the precharge voltage V1 is supplied to perform a verification operation on the basis of the sense current of the first level Ia. Reducing the time for supplying the precharge voltage V1 has the same effect on precharging a bit line as lowering the level of the precharge voltage V1. Accordingly, the same effect on the coupling resistance value as shown in FIG. 8A can be obtained.

Figure 8E:
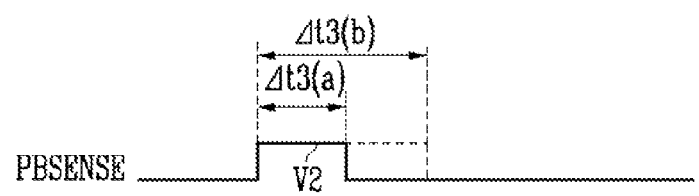

In one or more embodiments, as shown in FIG. 8E, a time $\Delta t3(b)$ during which the sense voltage V2 is supplied to perform a verification operation on the basis of the sense current of the second level Ib is set to be longer than a time $\Delta t3(a)$ during which the sense voltage V2 is supplied to perform a verification operation on the basis of the sense current of the first level Ia. As the time during which the sense voltage V2 is supplied is increased, the amount of charges drained to a bit line is increased. Accordingly, the same effect as a case in which a level of the sense voltage V2 is raised can be obtained.

Figure 9A:
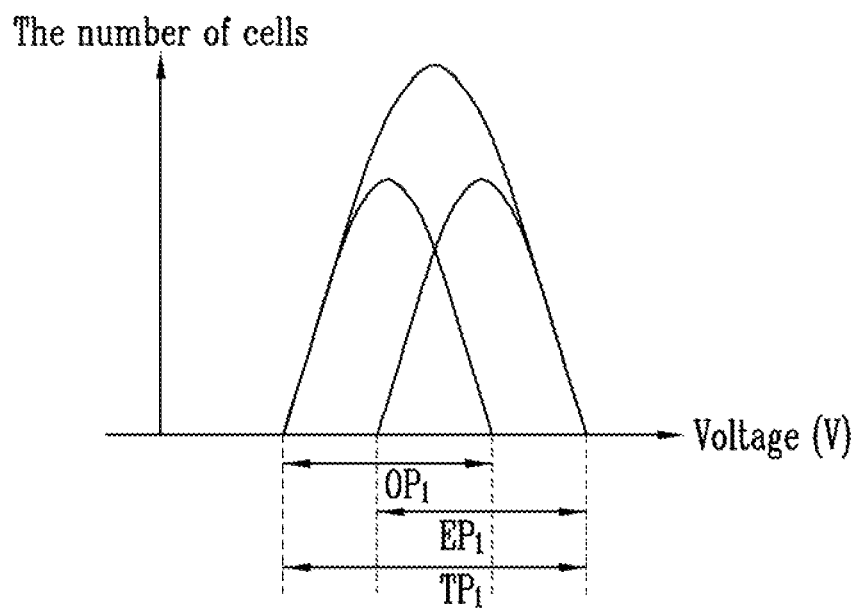
FIGS. 9A and 9B are diagrams illustrating the distribution of threshold voltages of the nonvolatile memory device according to an embodiment of the present invention.
Figure 9B:
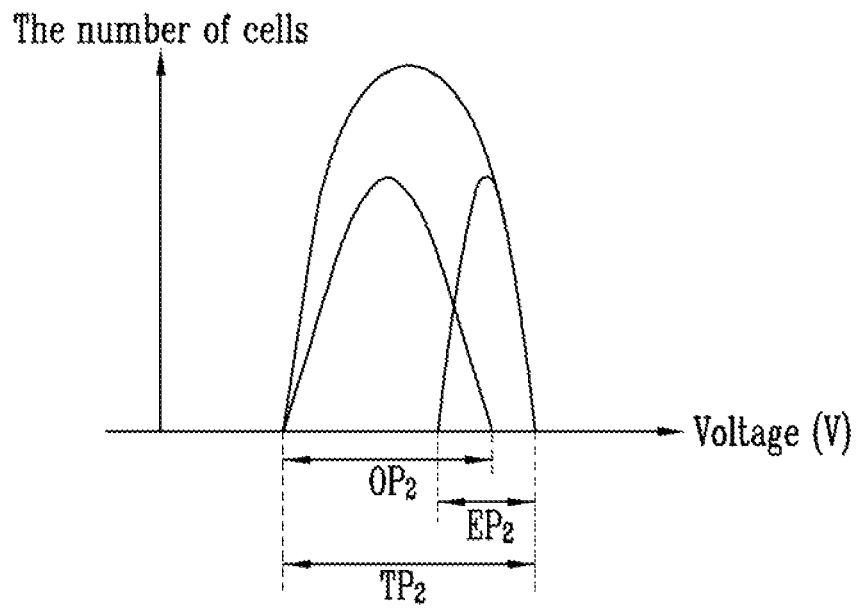

FIGS. 9A and 9B are diagrams illustrating the distribution of threshold voltages of the nonvolatile memory device according to an embodiment of the present invention.

As shown in FIG. 9A, in a related art, after an MSB program operation is performed on an even page and an odd page, threshold voltages of odd memory cells have a distribution $OP_1$. Furthermore, threshold voltages of even memory cells rise under the influence of the program operation for the odd page and so have a distribution $EP_1$. Accordingly, a general distribution of the threshold voltage is $TP_1$.

In the embodiment of the present invention, as shown in FIG. 9B, after an MSB program operation for an even page and an odd page is performed, threshold voltages of odd memory cells have a distribution $OP_2$. Furthermore, threshold voltages of even memory cells rise under the influence of the program operation for the odd page and so have a distribution $EP_2$. Accordingly, a general distribution of the threshold voltages is $TP_2$. Here, the distribution $OP_2$ is the same as the distribution $OP_1$, but the distribution $EP_2$ is narrower than the distribution $EP_1$ and so the distribution $TP_2$ is narrower than the distribution $TP_1$. This is because, in the embodiment of the present invention, a level of a sense current when the MSB program operation for the even memory cells is verified is set to be lower than the level of a sense current when the MSB program operation for the odd memory cells is verified. Therefore, a distribution of the threshold voltages of the even memory cells becomes narrower than a distribution of the threshold voltages of the odd memory cells. In other words, in the embodiment of the present invention, although the threshold voltages of the even memory cells increase because of the program operation for the odd page, the width of the threshold voltage distribution can be decreased. Accordingly, the highest value in the distribution of the threshold voltages of the even memory cells is lowered.

Furthermore, in accordance with the embodiment of the present invention, in the case in which an MSB program operation is performed on odd memory cells, but is not performed on even memory cells, a sense current having a low level is used when the MSB program operation for the odd memory cells is verified. Accordingly, the distribution of threshold voltages of memory cells on which the MSB program operation has been performed can be narrower than that when the sense current has a high level.

Meanwhile, in the embodiment of the present invention, when memory cells coupled to a selected word are programmed, the distribution of threshold voltages of the memory cells is narrowed. Accordingly, during a read operation like the program operation, when the program states of the memory cells are read by controlling the level of a sense current, the threshold voltages can be read with the width of their distribution being reduced as compared with a related art. That is, if a sense current having a first level has been used when a program operation for a selected memory cell is verified, the sense current having the first level is also to be used when a read operation for the selected memory cell is performed. Furthermore, if a sense current having a second level has been used when a program operation for a selected memory cell is verified, the sense current having the second level is also to be used when a read operation for the selected memory cell is performed.

Figure 10A:
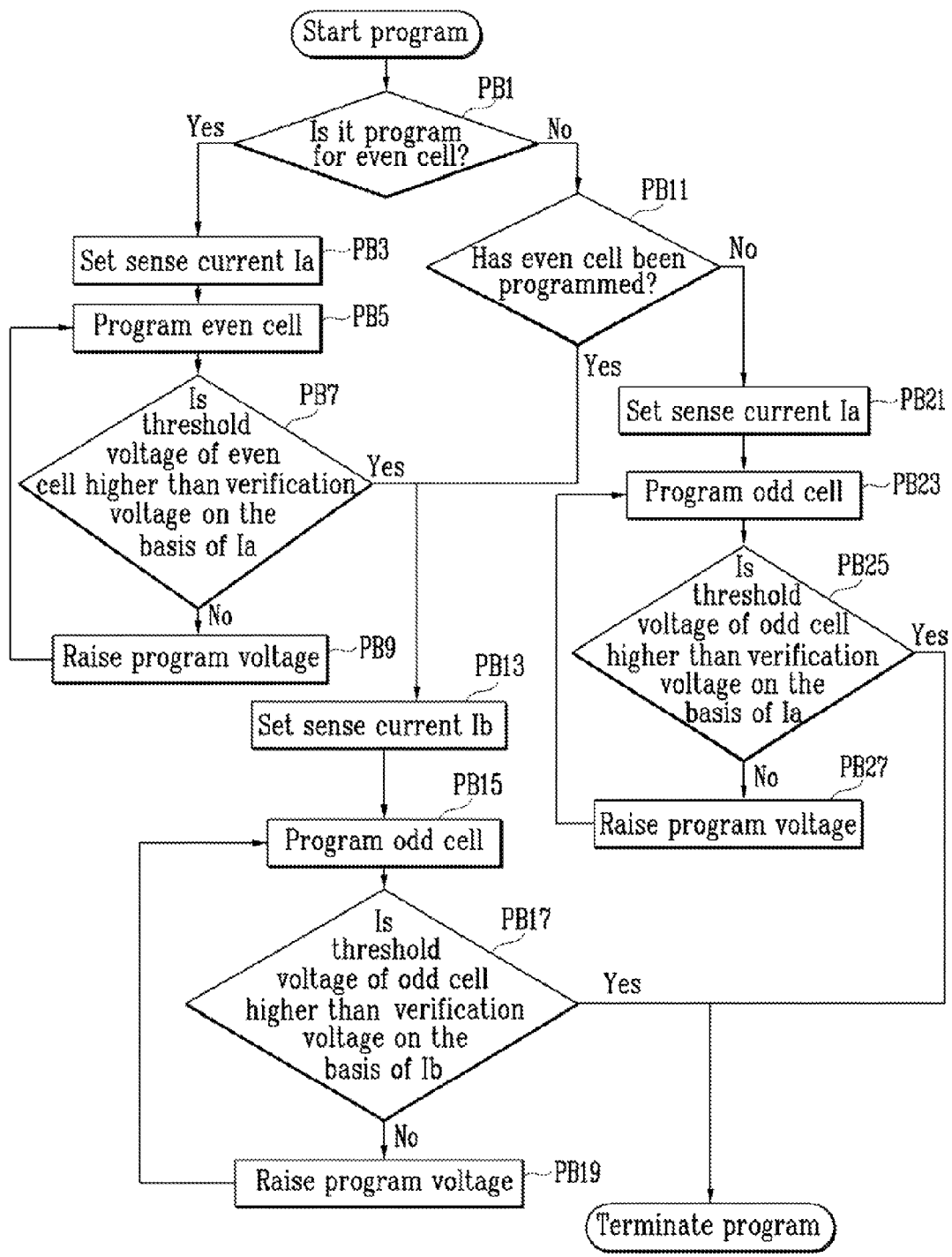
FIGS. 10A and 10B are flowcharts illustrating a method of operating the nonvolatile memory device according to another embodiment of the present invention.
Figure 10B:
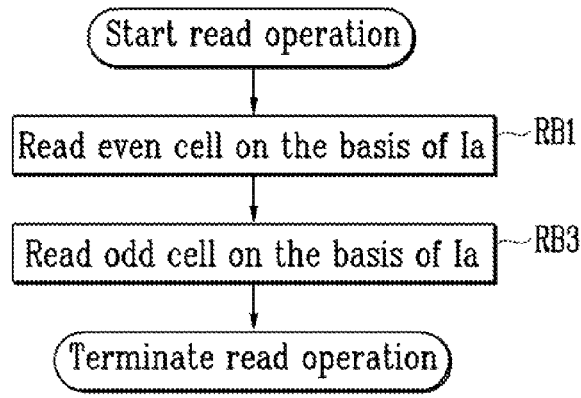

FIGS. 10A and 10B are flowcharts illustrating a method of operating the nonvolatile memory device according to another embodiment of the present invention. More particularly, FIG. 10A is a flowchart illustrating a program method in the operation of the nonvolatile memory device according to the embodiment of the present invention, and FIG. 10B is a flowchart illustrating a read method in the operation of the nonvolatile memory device according to the embodiment of the present invention.

As described above, if the level of a sense current is lowered, a threshold voltage of a selected memory cell is determined to be lower than that when the level of the sense current is relatively high. Furthermore, in the case in which all the memory cells coupled to the same word line are programmed, an even page including even memory cells coupled to an even bit line is programmed earlier than an odd page including odd memory cells coupled to an odd bit line. Accordingly, if the even page has been programmed when the program operation is performed on the odd page, threshold voltages of the even memory cells rise under the influence of the program operation for the odd page, thereby causing an increase in the distribution of the threshold voltages of the even memory cells. Accordingly, the odd memory cells are programmed to have threshold voltages higher than the threshold voltages of the even page program operation in consideration of a possible rise in the threshold voltages of the programmed even memory cells during the odd page program operation. Accordingly, the width of the distribution of threshold voltages of programmed memory cells can be reduced.

Referring to FIG. 10A in the embodiment of the present invention, in order to narrow the distribution of threshold voltages of programmed memory cells as described above, when program data to be programmed into memory cells coupled to a selected word line is received, it is first determined whether a program operation for a selected memory cell is a program operation for an even memory cell at step PB1. If, as a result of the determination, the program operation for the selected memory cell is determined to be the program operation for the even memory cell, a sense current is set to a first level Ia at step PB3. Next, the program operation for the even memory cell is performed by supplying a program voltage to the selected memory cell at step PB5. It is then determined whether a threshold voltage of the even memory cell is higher than a verification voltage on the basis of the sense current of the first level Ia at step PB7. If, as a result of the determination, the threshold voltage of the even memory cell is determined not to be higher than the verification voltage, the program voltage is raised by a step voltage at step PB9. Next, the step PB5 is repeated using the program voltage raised by the step voltage. The steps PB5 to PB9 are repeated for a predetermined number of times until the threshold voltage of the even memory cell becomes higher than the verification voltage at step PB7.

Meanwhile, if, as a result of the determination at step PB1, the program operation for the selected memory cell is determined not to be the program operation for the even memory cell, it is determined whether the program operation for the even memory cell has been performed at step PB11. Whether a specific memory cell has been programmed can be determined on the basis of data stored in a flag cell (not shown) electrically coupled to the specific memory cell.

If, as a result the determination at step PB11, the program operation for the even memory cell is determined to have been performed or, as a result of the determination at step PB7, the threshold voltage of the even memory cell is determined to be higher than the verification voltage, the sense current is set to a second level Ib lower than the first level Ia at step PB1 Next, at step PB15, a program operation for an odd memory cell is performed by supplying the program voltage to a selected memory cell. It is then determined whether a threshold voltage of the odd memory cell is higher than the verification voltage on the basis of the sense current of the second level Ib at step PB17. If, as a result of the determination, the threshold voltage of the odd memory cell is determined not to be higher than the verification voltage, the program voltage is raised by a step voltage at step PB19. The step PB15 is repeated using the program voltage raised by the step voltage. The steps PB15 to PB19 are repeated for a predetermined number of times until the threshold voltage of the odd memory cell becomes higher than the verification voltage at step PB17.

Meanwhile, if, as a result of the determination at step PB11, the program operation for the even memory cell is determined not to have been performed, a sense current is set to a first level Ia at step PB21. Next, a program operation for an odd memory cell is performed by supplying a program voltage to a selected memory cell at step PB23. It is then determined whether a threshold voltage of the odd memory cell is higher than a verification voltage on the basis of the sense current of the first level Ia at step PB25. If, as a result of the determination at step PB25 the threshold voltage of the odd memory cell is determined not to be higher than the verification voltage, the program voltage is raised by a step voltage at step PB27. The step PB23 is repeated using the program voltage raised by the step voltage. The steps PB23 to PB27 are repeated for a predetermined number of times until the threshold voltage of the odd memory cell becomes higher than the verification voltage at step PB25.

If, as a result of the determination at steps PB17 and PB25, the threshold voltage of the odd memory cell is determined to be higher than the verification voltage, the program operation for the memory cells coupled to the selected word line is terminated.

The level of the sense current can be controlled using the same method as described with reference to FIGS. 8A to 8E.

Referring to FIG. 10A, when a program operation for an odd memory cell is performed after a program operation for an even memory cell is performed, a sense current (i.e., a reference) for a verification operation of the odd memory cell is set to be lower than a sense current (i.e., a reference) for a verification operation of the even memory cell. In this case, a threshold voltage of the odd memory cell is verified to be programmed with a threshold voltage of a first level on the basis of the sense current of a second level Ib, while it is verified to be programmed with a threshold voltage of a second level higher than the first level on the basis of the sense current of a first level Ia. For this reason, after a program operation for memory cells coupled to selected word lines is performed using such a method shown in FIG. 10A, a read operation is performed using a method shown in FIG. 10B. In this case, the width of a distribution of the threshold voltages of the memory cells can be reduced.

That is, referring to FIG. 10B, a read operation for memory cells coupled to a selected word line is completed by reading an even memory cell on the basis of a sense current of a first level Ia at step RB1 and reading an odd memory cell on the basis of the sense current of the first level Ia at step R83. When the even memory cell and the odd memory cell are read on the basis of the sense current of the first level Ia as described above, a threshold voltage of a programmed odd memory cell is determined to be programmed with a threshold voltage higher than that when the verification operation is performed based on the second level Ib in FIG. 10A. Furthermore, if the odd memory cell has been programmed, a threshold voltage of a programmed even memory cell rises because of the program operation for the odd memory cell. Consequently, a distribution of the threshold voltages of the even memory cells greatly overlaps with a distribution of the threshold voltage of the odd memory cell, and so the distribution of threshold voltages of programmed memory cells is reduced.

Figure 11A:
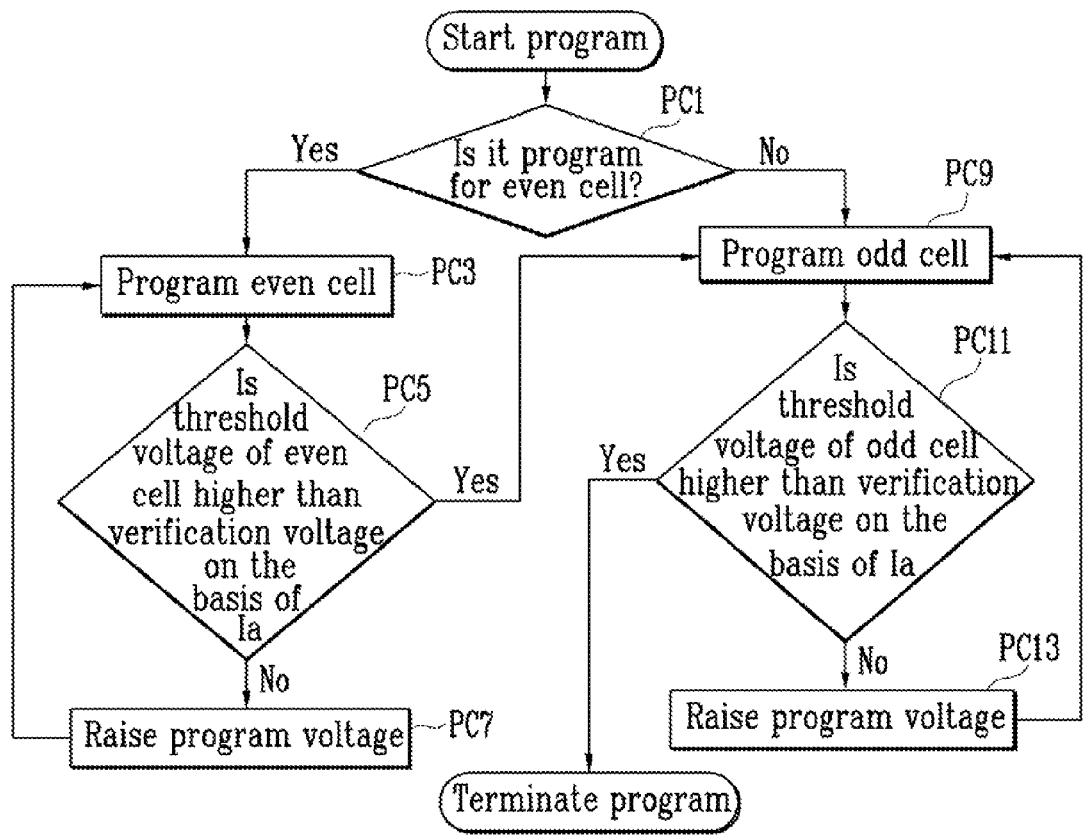
FIGS. 11A and 11B are flowcharts illustrating a method of operating the nonvolatile memory device according to yet another embodiment of the present invention.
Figure 11B:
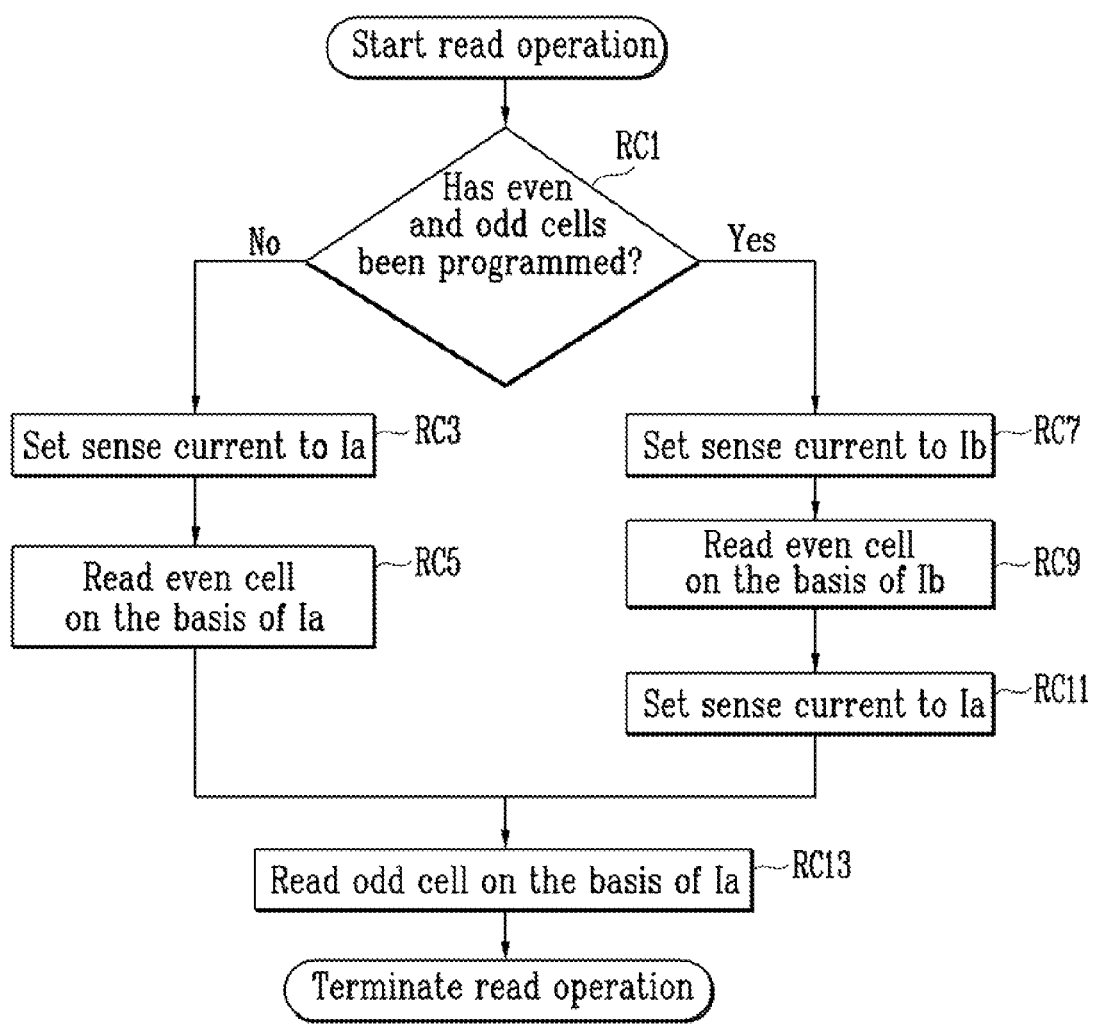

FIGS. 11A and 11B are flowcharts illustrating a method of operating the nonvolatile memory device according to further embodiment of the present invention. More particularly, FIG. 11A is a flowchart illustrating program method in the operation of the nonvolatile memory device according to the embodiment of the present invention, and FIG. 11B is a flowchart illustrating a read method in the operation of the nonvolatile memory device according to the embodiment of the present invention.

When the level of a sense current is lowered as described above, the threshold voltage of a selected memory cell is determined to be lower than that when the level of the sense current is relatively high. Furthermore, in the case in which all the memory cells coupled to the same word line are programmed, an even page including even memory cells coupled to an even bit line is programmed earlier than an odd page including odd memory cells coupled to an odd bit line. Accordingly, if the even page has been programmed when a program operation for the odd page is performed, the threshold voltages of the even memory cells rise under the influence of the program operation of the odd page, thereby increasing the width of the distribution of the threshold voltages of, for example, all the memory cells. Accordingly, when a read operation for the odd page is performed, if the threshold voltages of the even memory cells are read so that they are determined to be lower by taking a rise in the threshold voltages of the programmed even memory cells into consideration, the programmed memory cells can be read with the width of their threshold voltage distribution being reduced.

In the embodiment of the present invention, memory cells coupled to a selected word line are programmed using a method shown in FIG. 11A. More particularly, when program data is received, it is first determined whether a program operation for a selected memory cell is a program operation for an even memory cell at step PC1. If, as a result of the determination, the program operation for the selected memory cell is determined to be the program operation for the even memory cell, the program operation for the even memory cell is performed by supplying a program voltage to the selected memory cell at step PC3. At step PC5, it is then determined whether a threshold voltage of the even memory cell is higher than a verification voltage on the basis of a sense current of a first level Ia. If, as a result of the determination, the threshold voltage of the even memory cell is determined not to be higher than the verification voltage, the program voltage is raised by a step voltage at step PC7. The step PC3 is repeated using the program voltage raised by the step voltage. The steps PC3 to PC7 are repeated for a predetermined number of times until the threshold voltage of the even memory cell becomes higher than the verification voltage at step PC5.

Meanwhile, if, as a result of the determination at step PC1, the program operation for the selected memory cell is determined not to be the program operation for the even memory cell or, as a result of the determination at step PC5, the threshold voltage of the even memory cell is determined to be higher than the verification voltage, a program operation for an odd memory cell is performed by supplying a program voltage to a selected memory cell at step PC9. At step PC11, it is then determined whether a threshold voltage of the odd memory cell is higher than a verification voltage on the basis of a sense current of a first level Ia. If, as a result of the deter nation, the threshold voltage of the odd memory cell is determined not to be higher than the verification voltage, the program voltage is raised by a step voltage at step PC13. The step PC9 is repeated using the program voltage raised by the step voltage. The steps PC9 to PC13 are repeated for a predetermined number of times until the threshold voltage of the odd memory cell becomes higher than the verification voltage at step PC11.

However, if, as a result of the determination at step PC11 the threshold voltage of the odd memory cell is determined to be higher than the verification voltage, the program operation for the memory cells coupled to the selected word line is terminated.

In the case in which a program operation is performed as shown in FIG. 11A, if both an even memory cell and an odd memory cell have been programmed, a threshold voltage of the even memory cell rises when the odd memory cell is programmed. Accordingly, when a read operation is performed on the basis of a sense current having the same level as when a verification operation is performed, memory cells can be read with the width of their threshold voltage distribution being increased. In the embodiment of the present invention, the level of a sense current is controlled depending on whether an even memory cell and an odd memory cell have been programmed so that memory cells can be read with the width of their threshold voltage distribution being reduced.

More particularly, after a program operation for memory cells coupled to selected word lines is performed using such a method shown in FIG. 11A, it is determined whether program operations for an even memory cell and an odd memory cell have been performed at step RC as shown in FIG. 11B.

If, as a result of the determination, at least one of the even memory cell and the odd memory cell is determined not to have been programmed, a sense current is set to a first level Ia at step RC3. At step RC5, the even memory cell is read on the basis of the sense current of the first level Ia.

If, as a result of the determination at step PC1, the program operations for the even memory cell and the odd memory cell are determined to have been programmed, a sense current is set to a second level Ib at step RC7. The even memory cell is read on the basis of the sense current of the second level Ib at step RC9. In the case in which the program operations for both the even memory cell and the odd memory cell have been performed as described above, a threshold voltage of the even memory cell has risen under the influence of the program operation for the odd memory cell. However, if the even memory cell is read on the basis of the sense current of the second level Ib when a read operation for the even memory cell is performed, the even memory cell is read as being programmed with a threshold voltage lower than a threshold voltage when a verification operation for the even memory cell is performed on the basis of the first level Ia.

After the even memory cell is read on the basis of the sense current of the second level Ib, the sense current is set to a first level Ia at step RC11.

After the steps RC11 and RC5, the odd memory cell is read on the basis of the sense current of the first level Ia at step RC13. Thus, the read operation for the memory cells coupled to the selected word lines is terminated.

In the case in which both the even memory cell and the odd memory cell have been programmed as described above, when the even memory cell is read on the basis of the sense current of the second level Ib, a threshold voltage of the even memory cell is read as being low although it has risen because of the program operation for the odd memory cell. Accordingly, programmed memory cells can be read with the width of their threshold voltage distribution being reduced.

The level of a sense current can be controlled using the same method as described above with reference to FIGS. 8A to 8E.

Although some exemplary embodiments of the present invention have been described, those skilled in the art will appreciate that various modifications, additions and substitutions are possible, without departing from the scope and spirit of the invention as disclosed in the accompanying claims.

In accordance with an exemplary embodiment of the present invention, the level of a sense current (i.e., a reference) when a verification operation for memory cells coupled to an odd bit line is performed is adjusted by controlling coupling resistance value between the odd bit line and the page buffer, depending on whether even memory cells included in a selected page and coupled to an even bit line have been programmed. Accordingly, the width of a distribution of the threshold voltages of the memory cells can be reduced.

Furthermore, the level of a sense current (i.e., a reference) when a read operation for memory cells coupled to an even bit line is performed is adjusted by controlling coupling resistance value between the even bit line and the page buffer, depending on whether memory cells included in selected pages and coupled to even and odd bit lines have been programmed. Accordingly, the memory cells can be read with the width of their threshold voltage distribution being reduced.

As described above, in the embodiment, the memory cells can be read with the width of their threshold voltage distribution being reduced. Accordingly, an error of a read operation due to an increase in the width of the distribution of the threshold voltages can be prevented/reduced.

What is claimed is:

1. A method of operating a nonvolatile memory device, the method comprising:
   determining whether even memory cells coupled to even bit lines and odd memory cells coupled to odd bit lines in a selected page are programmed;
   setting a coupling resistance value between the even bit line and a page buffer as a first level or a second level depending on whether the even memory cells and the odd memory cells are programmed;
   performing a read operation for the even memory cells by coupling the even bit line to the page buffer to the first level of the coupling resistance value when the even memory cells and the odd memory cells are not programmed;
   setting a coupling resistance value between the odd bit line and the page buffer as the first level; and
   performing a read operation for the odd memory cells by coupling the even bit line to the page buffer to the first level of the coupling resistance value.

2. The method of claim 1, further comprising;
   coupling the even bit line to the page buffer to the second level of the coupling resistance value when the even memory cells and the odd memory cells are programmed, wherein the coupling resistance value of the second level is higher than that of the first level; and
   performing a read operation for the even memory cells by coupling the even bit line to the page buffer to the second level of the coupling resistance value;
   setting a coupling resistance value between the odd bit line and the page buffer as the first level; and
   performing a read operation for the odd memory cells by coupling the odd bit line to the page buffer to the first level of the coupling resistance value.

3. The method of claim 1, further comprising, before determining whether the even memory cells and the odd memory cells are programmed:
   programming the even memory cells; and
   performing a verification operation for verifying whether threshold voltages of the programmed even memory cells are a target voltage or more by coupling the even bit line to the page buffer to the first level of the coupling resistance value.

4. The method of claim 3, wherein a program operation and the verification operation for the even memory cells are repeated until the threshold voltages of the even memory cells become the target voltage or more.

5. The method of claim 4, wherein whenever the program operation for the even memory cells is repeated, a program voltage supplied when the program operation for the even memory cells is performed is raised by a step voltage.

6. The method of claim 1, further comprising, before determining whether the even memory cells and the odd memory cells are programmed:
   programming the odd memory cells; and
   performing a verification operation for verifying whether threshold voltages of the programmed odd memory cells are a target voltage or more by coupling the odd bit line to the page buffer to the first level of the coupling resistance value.

7. The method of claim 6, wherein a program operation and the verification operation for the odd memory cells are repeated until the threshold voltages of the odd memory cells become the target voltage or more.

8. The method of claim 7, wherein whenever the program operation for the odd memory cells is repeated, a program voltage supplied when the program operation for the odd memory cells is performed is raised by a step voltage.

9. The method of claim 1, wherein the coupling resistance value between the even bit line and the page buffer is set by controlling a sense control transistor configured to couple the even bit line to the page buffer in response to a precharge voltage, to precharge the even bit line, and to couple the even bit line to the page buffer according to a voltage level of the even bit line in response to a sense voltage.

10. The method of claim 9, wherein the coupling resistance value between the even bit line and the page buffer is increased by lowering a level of the precharge voltage, raising a level of the sense voltage, reducing a time during which the sense control transistor is turned off before the sense voltage is supplied after the precharge voltage is supplied, reducing a time during which the precharge voltage is supplied, or increasing a time during which the sense voltage is supplied.

* * * * *